United States Patent [19]

Ripstrand et al.

[11] Patent Number: 5,386,198

[45] Date of Patent: Jan. 31, 1995

[54] LINEAR AMPLIFIER CONTROL

[75] Inventors: Krister I. Ripstrand, Uppsala; Thorsten Nygren, Taby, both of Sweden

[73] Assignee: Telefonaktiebolaget L M Ericsson, Stockholm, Sweden

[21] Appl. No.: 10,274

[22] Filed: Jan. 28, 1993

[51] Int. Cl.6 ................................................ H03F 1/32
[52] U.S. Cl. ...................... 330/52; 330/149; 330/151
[58] Field of Search .............. 330/52, 149, 151; 328/163

[56] References Cited

U.S. PATENT DOCUMENTS

| | | |
|---|---|---|
| 3,766,486 | 10/1973 | Ouvrier . |
| 3,781,703 | 12/1973 | Duty . |
| 3,918,003 | 11/1975 | Seidel . |
| 3,922,617 | 11/1975 | Denniston et al. . |
| 4,291,277 | 9/1981 | Davis et al. . |
| 4,389,618 | 6/1983 | Bauman . |
| 4,554,514 | 11/1985 | Whartenby et al. . |
| 4,560,945 | 12/1985 | Olver . |
| 4,580,105 | 4/1986 | Myer . |
| 4,812,779 | 3/1989 | Wagner . |
| 4,879,519 | 11/1989 | Myer . |
| 4,885,551 | 12/1989 | Myer . |
| 4,926,134 | 5/1990 | Olver . |
| 4,943,783 | 7/1990 | Nojima . |
| 4,987,378 | 1/1991 | Eggleston et al. . |
| 5,051,704 | 9/1991 | Chapman et al. . |
| 5,065,110 | 11/1991 | Ludvik et al. . |
| 5,077,532 | 12/1991 | Obermann et al. . |
| 5,155,448 | 10/1992 | Powell ........................ 330/151 X |

FOREIGN PATENT DOCUMENTS 2167256 5/1986 United Kingdom .
2244881 12/1991 United Kingdom .

*Primary Examiner*—James B. Mullins
*Attorney, Agent, or Firm*—Burns, Doane, Swecker & Mathis

[57] ABSTRACT

A method and apparatus for controlling a feed-forward compensated power amplifier system is disclosed which uses a spread spectrum technique to cover a control signal or signals and injects a composite signal at a suitable point into the feed-forward amplifier system to reduce distortion. The amount of bandwidth spread is governed by the amount of processing gain needed in the remapping process and the needed time response of the system. Control signals after remapping of the spread spectrum at the output of the system are correlated in a match filter correlator and the result is used to control, in either polar or cartesian coordinates, the injection, in anti-phase, of the extracted distortion into the feed forward amplifier output.

44 Claims, 8 Drawing Sheets

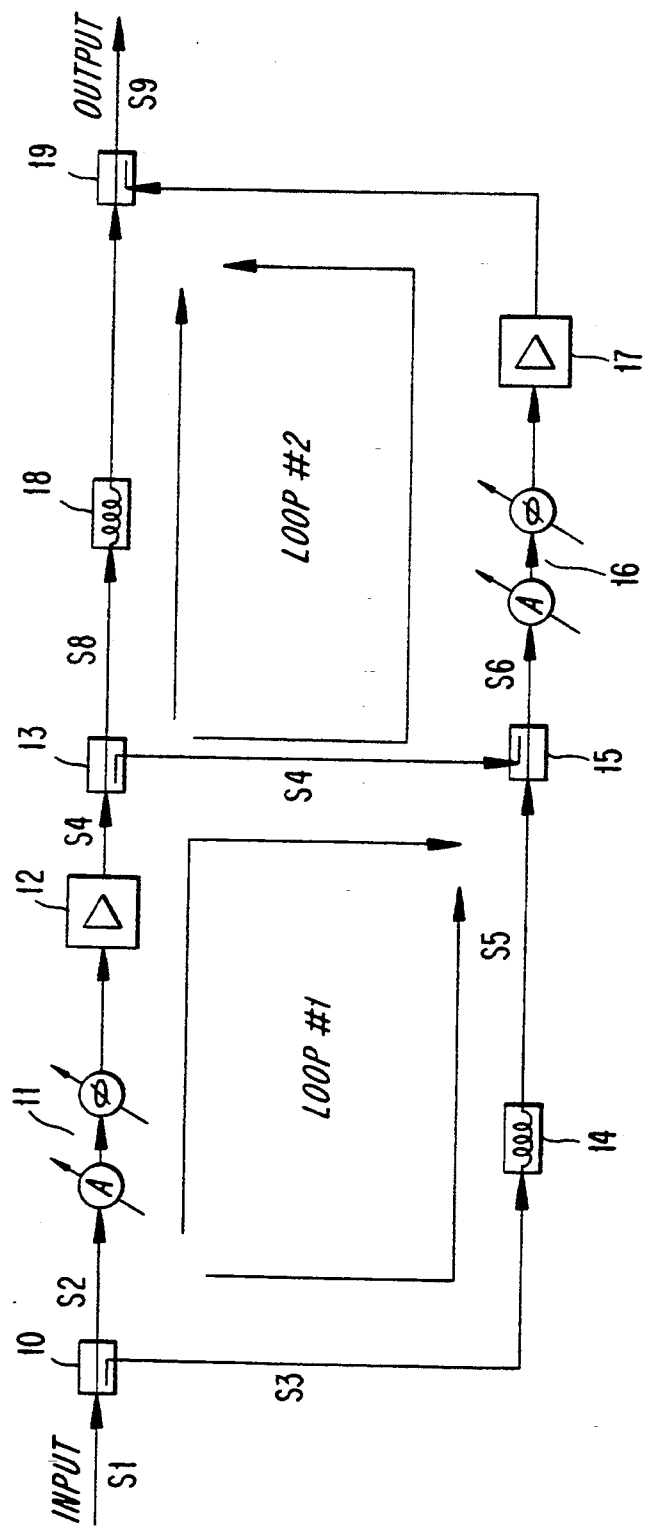

LINEAR AMPLIFIER CONTROL

FIELD OF THE INVENTION

The present invention relates to high powered linear amplifiers and in particular to a new control system using spread spectrum and feed forward techniques for the reduction of distortion introduced by high powered amplifiers.

BACKGROUND OF THE INVENTION

It is well known in the art that all amplifiers distort an inputted signal. The distortion becomes greater as the power levels are increased. When amplifier compression and group delay distortion is introduced into a single information carrying channel, or when the amplifier is exposed to multiple input signals, intermodulation (IM) products are introduced. These IM products must be kept low because they interfere with the system or with other users. Methods have therefore been developed to reduce these types of distortion.

There are two types of distortion introduced by an amplifier. The first type of distortion, referred to as linear distortion, is related to the frequency dependent gain and phase response of the amplifier. The phase response is not the absolute phase value, but rather the part differing from the linear phase, i.e., the time delay in the amplifier. The second type of distortion, referred to as non-linear distortion, is produced by the non-linear gain-to-input power in the amplifier. The linear part of the distortion plays a significant role in wide band applications.

The distortion caused by single carrier power amplifiers can be dealt with by using feedback techniques such as cartesian feedback. The main drawback with using feedback is the narrow bandwidth within which the distortion can be reduced because of stability constraints.

The wideband amplifier is becoming more attractive as a carrier power amplifier because of the improved systems flexibility it offers over ordinary multiple single carrier power amplifiers using passive filter combination techniques at their outputs. In wideband systems, there are two main methods for dealing with distortion: predistortion; and feed-forward. Predistortion means that the non-linear and/or the linear part of the distortion introduced by the main amplifier is inversely modeled at the input of the amplifier, thereby making the total, ideally, equal to a frequency independent constant. To reduce the linear distortion, a simple filter is needed; and to reduce the non-linear distortion, a "curve bender" needs to be used. However, both methods have to be adapted to overcome aging, temperature and sample differences.

The feed-forward technique consists basically of two independent steps. The first step is to extract the distortion introduced by the main amplifier on the signals to be amplified. This is referred to as extracting an error signal. The second step is to inject this error signal in anti-phase and time aligned at the output of the feed-forward amplifier to thereby cancel out the distortion.

The main differences between the feed-forward technique and the predistortion method is that in the feed-forward technique the distortion is extracted rather than modelling the distortion causing element, making the feed forward technique more sample independent. The two steps can be repeated at the output of the feed-forward amplifier system to further suppress distortion components. The performance of the feed-forward technique is dependent upon the ability to add rotated signal vectors correctly in anti-phase and equal amplitude. This process determines how well a distortion component can be extracted or suppressed. The ability to control these variables, i.e., gain and phase, are therefore of crucial importance in feed-forward amplifier systems.

Several methods for controlling the extraction of distortion and/or injection of the extracted distortion in anti-phase have been introduced in the past. There are two main methods of how to control a feed-forward amplifier system. The first method uses the actual distortion caused by the main amplifier to control the setting of the gain and phase controls. This is possible since it equals the first step in the feed-forward process. In this case, the error signal content is minimized at the output. Second method uses a known distortion simulating signal which is injected in the amplifier path and minimized at the output thereby also reducing the distortion introduced by the main amplifier. The term distortion shall be understood to mean any signals present in the output of a device which were not C present at the input.

U.S. Pat. No. 4,389,618 is an example of the first method for controlling a feed-forward amplifier system in which the system correlates the extracted distortion with the distortion present at the output. The correlation yields a setting of the gain and phase of the extracted distortion, i.e., the error signal, which is subtractively combined with the output. The patent also shows the addition of a third loop to reduce the signal components from the output. This decreases the correlation score between signal components at the output and the remaining signal components, due to linear distortion in the main amplifier, in the extracted error signal. The correlation score between distortion components has to be higher than the correlation score between signal components in order to yield the best setting of the gain and phase of the subtractively combined error signal.

U.K. Patent No. 2 167 256A discloses a similar system which includes a non-automated third loop. The reduction in signal component correlation score due to the third loop is not sufficient for a wideband feed-forward amplifier system due to the linear distortion introduced by the main amplifier. To overcome this problem, U.K. Patent Application No. 2 244 881 uses multiple input controls, which to a high degree will cancel out the linear part of the distortion emanating from the main amplifier.

With a multiple input system with one input loop for every input channel, all linear distortion can theoretically be removed. The extracted error signal would then only contain non-linear distortion which can be correlated with the output signal to yield a non-interfered setting of the amplitude and phase control of the subtractively combined error signal.

The number of required input loops is governed by the linear distortion, exhibited over the used frequency range by the main amplifier and will determine the amount of the remaining unwanted signal components in the error signal. In a simple correlation technique, it is desirable for the remaining signal components to be less than the extracted non-linear distortion in order to achieve easy control of the second loop. To avoid over specification of the linear part of the distortion in the main amplifier, the amount of input loops can increase rapidly in a wideband system, with an increase in the number of control loops and other components to follow.

U.S. Pat. No. 4,580,105 is an example of the second method for controlling a feed-forward amplifier system where a narrow band distortion simulating pilot tone is injected into the system. The pilot tone is extracted in a narrow band pilot receiver at the output of the amplifier. The pilot tone is detected and minimized using a decreasing step size circuit algorithm thereby reducing the distortion introduced by the main amplifier. The drawback with injected pilot tones is that a pilot tone cannot be given an arbitrary frequency, but is governed by the input signals to be amplified in the feed-forward amplifier. The pilot tone must be placed in the same frequency range as the input signal in order to be helpful. Since the pilot has no special labeling or modulation, the control scheme is sensitive to other narrowband signals on the same frequency, such as various signals within the transmitter system.

SUMMARY OF THE DISCLOSURE

The present system describes a method for controlling a feed-forward amplifying system to reduce distortion in a power amplifier. The method can be used in both narrowband and wideband applications. The present control method uses a spread-spectrum technique to cover a control signal or signals and injects a composite signal at a suitable point, with injection couplers into the feed-forward amplifier system.

There are several spread spectrum (SS) techniques available such as direct sequence spread spectrum (DSSS), frequency hopped spread spectrum (FHSS) and pulsed FM spread spectrum (PFMSS) and any other technique achieving a processing gain in the remapping process.

The amount of bandwidth spread is governed by the amount of processing gain needed in the remapping process and the needed time response of the system. In general, however, the spreading bandwidth should occupy a major part of the frequency range used by the feed-forward amplifier system in order to derive the benefits from the processing gain. A control signal or signals after remapping of the spread spectrum at the output of the system are correlated in a matched filter correlator and the result is used to control, in either polar or cartesian coordinates, the injection in antiphase of the extracted distortion into the feed-forward amplifier output. The method can handle the case where wideband multiple input signals are precombined before entering the single input feed-forward amplifier system as well as the single input channel case.

Since the control signals are covered in the composite signal and the remapping of the spread spectrum gives a processing gain over the non-correlated signals, amplified by the feed-forward amplifier system, the frequency of the control signals can be completely arbitrary. The control signals can therefore be placed where they are most beneficial to the systems ability to suppress distortion. For instance, one can receive information of where to minimize the distortion or receive information of the transmitted channels and calculate the best placement of the control signals. The power of the control signals, the integration time after remapping, and the spreading bandwidth are interchangeable to increase system flexibility with regard to the settling time. Since the control signals are known to the system, simple matched filter correlators can be used to keep track of the phase and amplitude. The control signals are also geared to be modulated arbitrarily to increase the tolerance against interfering signals present at their respective carrier frequencies.

In another embodiment of the present invention, the input signals to the feed forward amplifier system are modulated with a control signal in phase and/or in amplitude. The modulation acts as simulated distortion which when minimized with the aid of demodulation and a matched filter correlator at the output of the feed forward amplifier system will also minimize the distortion introduced by the main amplifier. One of the merits of this embodiment is that it uses already present input signals as carriers for the control signal thereby minimizing the need for expensive HF-carrier generation within the feed forward amplifier system.

BRIEF DESCRIPTION OF THE DRAWINGS

These and other features and advantages of the invention will be readily apparent to one of ordinary skill in the art and the following written description in conjunction with the drawings, in which:

FIG. 1 illustrates a prior art feed-forward amplifier system;

DETAILED DESCRIPTION OF THE PREFERRED EMBODIMENTS

Figure 3:
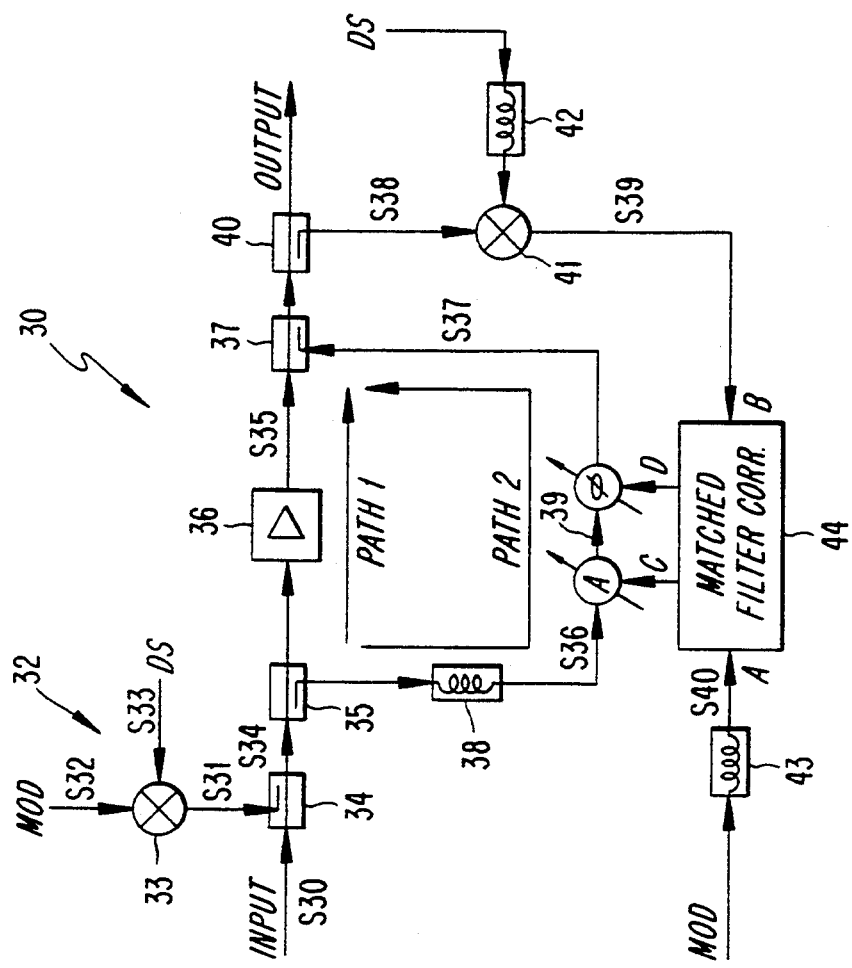
FIG. 3 illustrates a generalized use of the present invention.

FIG. 1 illustrates a prior art circuit in block diagram form of a feed-forward amplifier system. In FIG. 1, there is shown two paths: loop 1; and loop 2. The purpose of the gain and phase controls 11 and 16, respectively, is to make the two paths in each loop equal in amplitude but opposite in phase, thereby extracting the distortion in the loop 1 and injecting it in anti-phase into loop 2. The amplitude and phase control 11 can also be placed in the opposite path. The advantage is that the main amplifier 12 is exposed to a constant mean input power. However, the disadvantage is that the noise figure for the system will increase and will be dependent on the gain setting in the amplitude and phase control 11. Also, the amplitude and phase control 11 will introduce some distortion, which will be taken care of when the amplitude and phase control 11 is positioned as shown in FIG. 1, but will not be taken care of when placed in the opposite path. The amplitude and phase control 16 could also be placed in the opposite path of loop 2. However, it is more obvious to place the amplitude and phase control 16, as shown in FIG. 1, since the signal path S8 is a high level path which makes the implementation of the amplitude and phase control 16 virtually impossible.

A splitter 10 causes the input signal S1 to be duplicated. One part of the input signal S1, i.e., signal S2, is sent via the amplitude and phase control 11 to the main amplifier 12, while the other part of the input signal S1, i.e., signal S3, is directed to a combiner 15 via a delay element 14. A splitter 13 duplicates the amplified input signal which now contains the linearly distorted input signal S1 and new frequency components caused by the non-linearity of the main amplifier 12 into two signals S4 and S8.

The signal S4 is combined in a combiner 15 with a signal S5, which is the signal S3 that has been delayed in delay element 14. With proper adjustment of the amplitude and phase control 11, the combined signals S4 and S5 will contain all of the distortion introduced by the main amplifier 12. This signal S6 is referred to as the error signal. The error signal S6 is amplified in an error amplifier 17. With a proper adjustment of the amplitude and phase of the error signal S6, the error signal can be subtractively combined in a combiner 19 with the output signal S8 from the amplifier which has been delayed in delay element 18, thereby substantially reducing the distortion content of the output signal S9. As a result, the performance of the feed-forward amplifier system is governed by the proper adjustment of the amplitude and phase controls 11 and 16, respectively.

Figure 2:
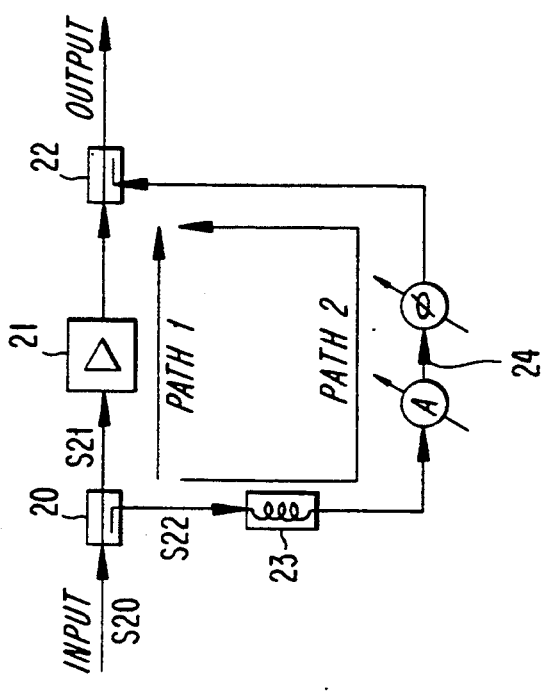
FIG. 2 illustrates a generalized use of the present invention.

FIG. 2 illustrates a typical loop in a feed-forward amplifier system. In order to extract the distortion caused by the amplifier 21, the two signal paths, Path 1 and Path 2, which are joined at their respective inputs and outputs, need to be adjusted so that they are equal in amplitude, but have an opposite phase response. As a result, a signal injected at the input will be cancelled at the output. However, any signal injected into or created within any of the two paths will be present at the output. Also, a signal can not be cancelled if it is extracted from anywhere else except from the output. A sampler 20 samples a portion of the input signal S20 creating two identical signals S21 and S22. The signal S22 passes through the delay element 23 which equals the delay in path 1 which is mainly caused by the delay caused by the amplifier 21. The amplitude and phase of the signal is further adjusted by means of an amplitude and phase controller 24. Finally, the adjusted signal is added to the path 1 signal by means of an injection coupler 22.

FIG. 3 illustrates one embodiment of the present invention wherein the adjustment of an amplitude and phase controller is performed automatically. An input signal S30 is combined with a composite signal S31 from a spread spectrum composite signal generator 32 in a coupler 34. By minimizing the injected frequency spread of a MOD signal S32 at the output, any other signal present at the input will also be minimized at the output. The MOD signal S32 is frequency spreaded by a direct sequence (DS) S33 in a multiplier 33. The combined signal S34 is then sampled by a sampler 35 which has two output ports. An amplifier 36 amplifies the combined and sampled signal S34 and outputs the amplified signal S35 to a combiner 37. The combined signal S34 is also sent to a delay element 38 in path 2. The delayed signal S36 is then sent to an amplitude and phase controller 39 which can adjust the amplitude and phase of the delayed signal S36. The adjusted signal S37 is then combined with the amplified signal S35 in combiner 37 to produce a second combined signal. The second combined signal is then sampled by a sampler 40. The sampled signal S38 is multiplied with a delayed version of the direct sequence signal by a multiplier 41, thereby remapping the frequency spreaded MOD signal and at the same time spreading any other non-correlated signals. The remapped MOD signal S39 is correlated with a delayed version of the injected MOD signal S40 by a matched filter correlator 44, thereby yielding control signals which adjust the amplitude and phase controller 39. The delay elements 38, 42 and 43 each accounts for the delay introduced into the path 1. As a result, the present invention can be used to control any of the loops illustrated in FIG. 1.

Figure 4:
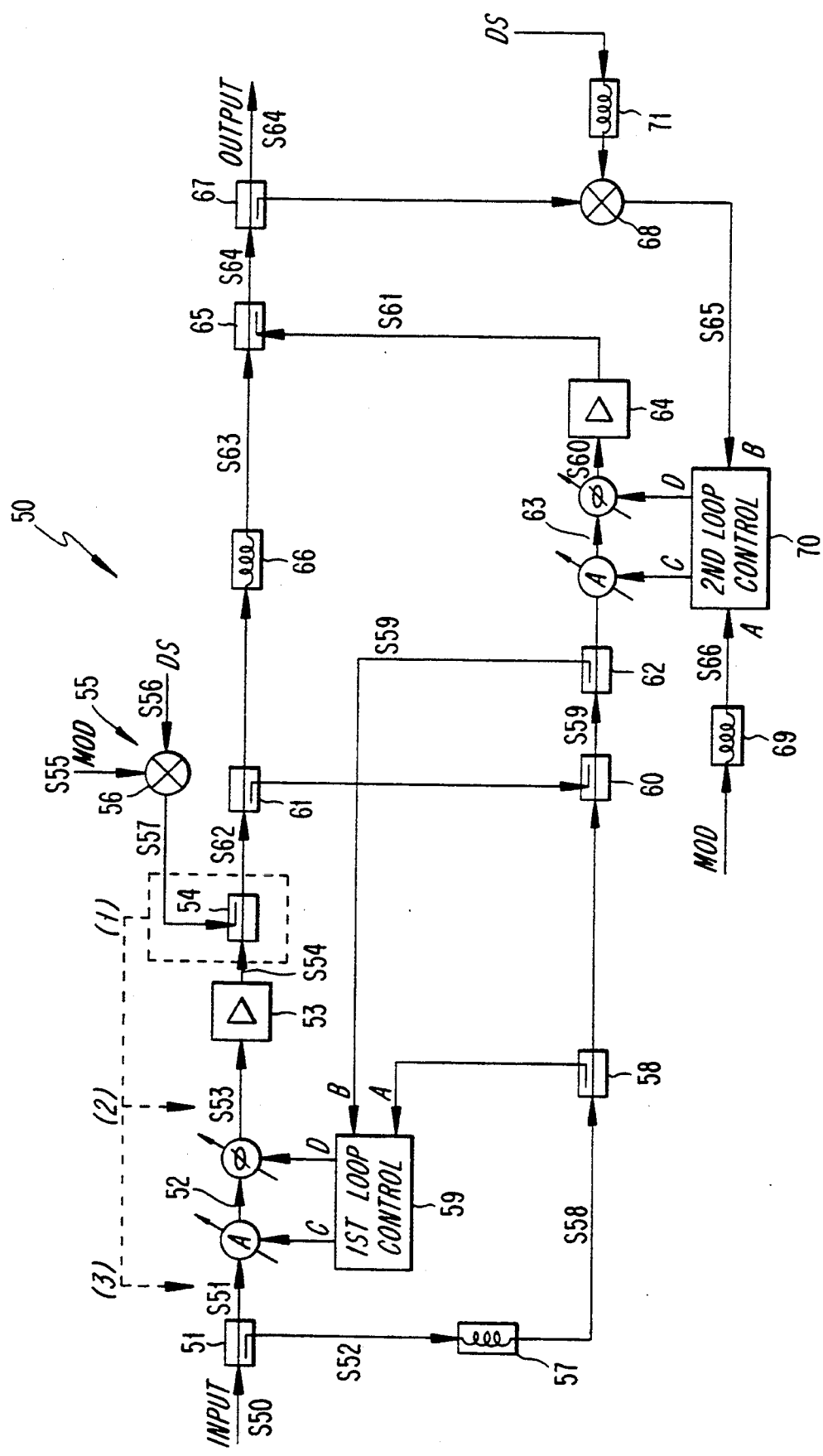
FIG. 4 illustrates a block diagram of a preferred embodiment of the present invention.

Referring to FIG. 4, there is shown a preferred embodiment of the present invention which builds upon the circuit illustrated in FIG. 3, by adding a second loop controller and by illustrating several optional placement (1)–(3) of the injection coupler. The optional placements (1) and (2) of the injection coupler 54 gives the advantage of injection at a lower level, but also gives a reduction in processing gain in the remapping process because of the linear distortion introduced by the main amplifier 53. Also, the time delay in the delay elements 69 and 71 will have to be increased so as to include the time delay introduced by the main amplifier 53. Using the optional placement (3) of the injection coupler 54 makes the control of the second loop controller 70 dependent upon the first loop controller 59.

As illustrated in FIG. 4, an input signal S50 is sampled in a sampler 51 to produce two identical input signals S51 and S52 (identical when normalized in amplitude). The input signal S51 is sent to an amplitude and phase controller 52 which can adjust the amplitude and phase of the input signal S51. The adjusted input signal S53 is then applied to the amplifier 53 which amplifies the input signal and outputs an amplified signal S54 to a combiner 54. In a spread spectrum signal generator 55, a control signal (MOD) S55, which acts as simulated distortion, is frequency spreaded in the multiplier 56 by the spreading sequence signal (DS) S56. The composite signal S57 is thereafter injected into the system through the coupler 54.

The input signal S52 is delayed in a delay element 57 for a time period that equals the delay introduced in the opposite path. The delayed signal S58 is then sampled in a sampler 58 which duplicates the delayed signal. One output of the sampler 58 is connected to a first loop controller 59, while the other output is connected to a combiner 60. A sampler 61 duplicates the output signal S62 from the coupler 54 and sends the signal to the combiner 60 where it is combined with the sampled signal S58. The output signal S59 of the combiner 60 is sampled in a sampler 62 and the output signal S59 is sent to the first loop controller 59, which correlates the sampled signal S58 and signal S59 to control the amplitude and phase controller 52.

The output signal S59 is also sent to a second amplitude and phase controller 63 which can adjust the amplitude and phase of the signal S59. The adjust signal S60 is then sent to an error amplifier 64 which amplifies the signal and outputs the amplified signal S61 to a combiner 65. The sampled output signal S62 is also sent to a delay element 66 which delays the sampled signal S62 for a time equal to the delay introduced by the opposite path before outputing a delayed signal S63 to the combiner 65. The combiner 65 combines the delayed signal S63 with the amplified signal S61 to produce the output signal S64 of the amplifier system 50.

At the output of the amplifier system 50, a portion of the signal is sampled by a sampler 67. The output sampled signal S64 is multiplied with a delayed version of the direct sequence signal (DS) S56 by a multiplier 68, thereby remapping the frequency spreaded MOD signal and at the same time spreading any other noncorralated signals. The MOD signal S55 is delayed in a delay element 69 and the delayed signal S66 is sent to a second loop controller 70. The second loop controller 70 correlates the delayed signal S66 with the remapped signal S65 to control the amplitude and phase controller 63.

Figure 5:
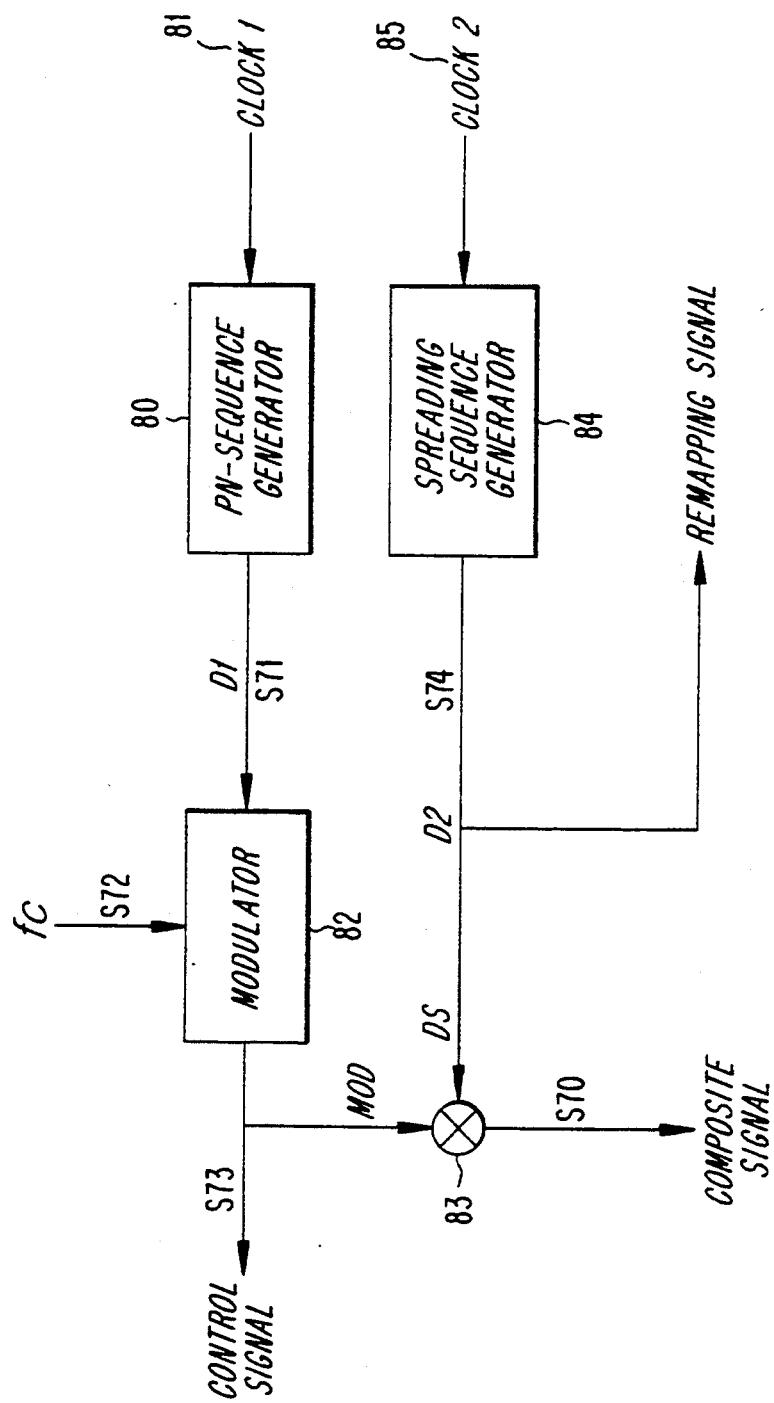
FIG. 5 illustrates a spread spectrum composite signal generator.

Referring to FIG. 5, there is shown in block diagram of a spread spectrum composite signal generator. The composite spread spectrum signal, for instance S70, is derived before it is injected into the feed-forward amplifier system. With a pseudo-noise sequence generator 80 driven by a clock 81, a bit stream S71 is derived, which is used to modulate the carrier signal S72 in a modulator 82. This carrier modulated signal S73 is then used as the control signal after a proper time delay, to control the system. This is one way to derive the actual control signal S73. The simplest form of the control signal is equal to the carrier signal S72. The control signal S73, before being injected into the system, is frequency spreaded in the multiplier 83 with the spreading sequence S74. The spreading sequence S74 is derived from the spreading sequence generator 84, which is driven by a clock 85. The spreading sequence S74, after a proper time delay, is used in the remapping process of the frequency spreaded spectrum. The processing gain in the remapping process is equal to the ratio of the bit stream speeds. This means that for a given speed D2, using a unmodulated carrier as a control signal S73, yields the largest processing gain in the remapping process.

The spreading sequence generator 84 and the PN-sequence generator 80 are preferably of a type yielding maximum auto correlation and minimum cross correlation to any other signal, which is important in the remapping process and in the matched filter correlator, for maximum processing gain. There are several types of sequences which can be used where ML- (Maximum Length), Gold- and Kasami- sequences are easily implemented with linear feedback shift registers by one of ordinary skill in the art. The modulator 82 can be of any suitable type such as MSK, OQPSK, preferably having a constant envelope and no introduction of intersymbol interference.

Figure 6:
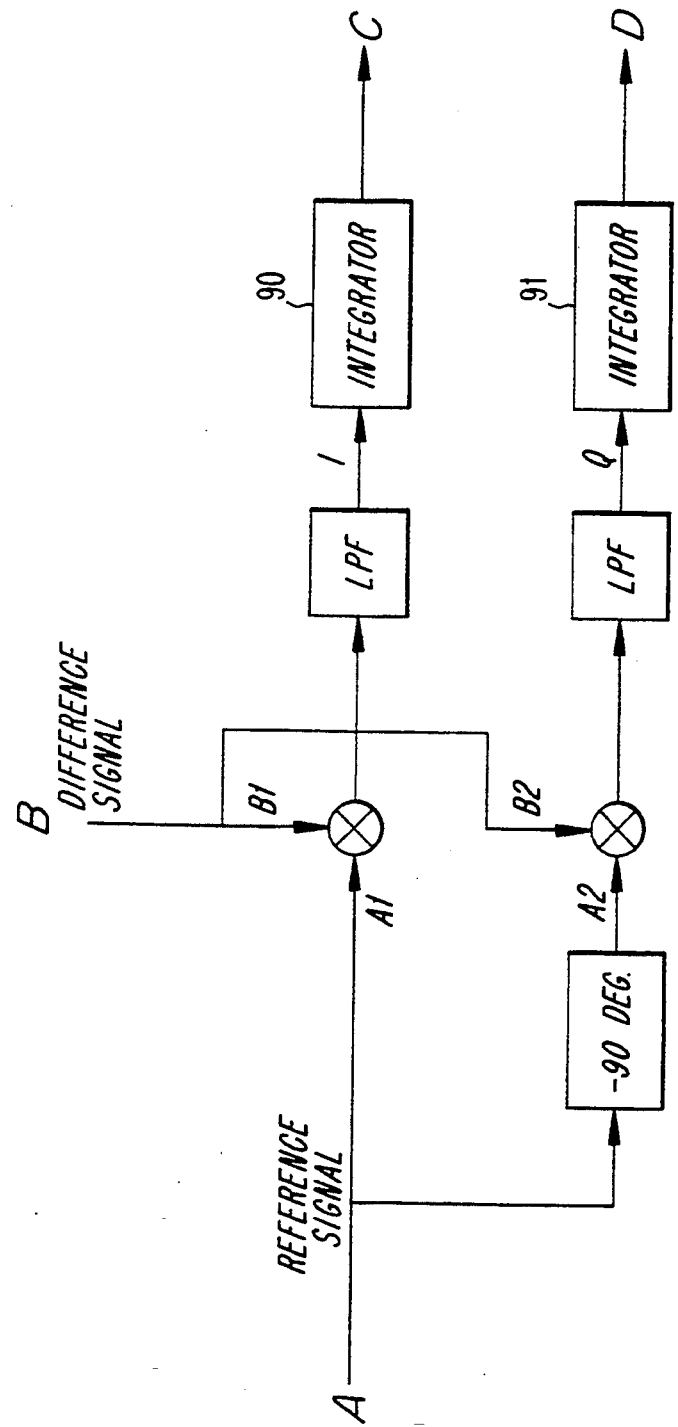
FIG. 6 illustrates a possible configuration of the matched filter correlator function.

Referring now to FIG. 6, there is shown, in block diagram form, how the loop controllers which provide signals to set the amplitude and phase controllers are functionally implemented. The function of the circuit is to perform an energy measurement, in the cartesian coordinate plane IQ, on a difference signal with a cartesian coordinate plane defined by a I/Q split reference signal. The function of the circuit can also be regarded as an I/Q demodulator or a matched filter correlator. The function is possible since the sensing is made on the reference signals and the difference between the reference signals and the difference signals. If it is assumed that the time alignment between the reference signals and the difference signals are correct, with the aid of properly set time delays, the circuit will perform the following function for any single frequency component:

reference signal=cos(wt)

difference signal=cos(wt)−A cos(wt+fi)

where A is the gain and fi is the phase anomality introduced by the signal path.

$I = \cos(wt)^2 - A/2 \cos(2wt+fi) - A/2 \cos(fi)$ $= 1/2 - A/2 \cos(fi)$ $= 1/2[1 - A\cos(fi)]$ $Q = \sin(wt)\cos(wt) - A\sin(wt)\cos(wt+fi)$ $= -A/2 \sin(fi)$ For small angles (fi), signals 104 and 105 can be integrated by integrators 90 and 91 and used for an I signal to a control of the gain of for instance, amplitude and phase controller 52 illustrated in FIG. 4, and for a Q signal to control the phase of the amplitude and phase controller. The easy integration is possible due to the fact that when the system is settled the angle is identical to 0 and the amplitude is identical to 1. The dynamics on the amplitude and phase controller 52 are governed by the gain and phase response over frequency and power of the main amplifier 53. The same is true for the amplitude and phase controller 63, for the sampled error signal S59 in this case the response of the error amplifier. The use of this simple technique is particularly useful and described in the system illustrated in FIG. 4, to control the gain and the phase of the loop 2 because the reference signal S58 is constant in amplitude.

Figure 7:
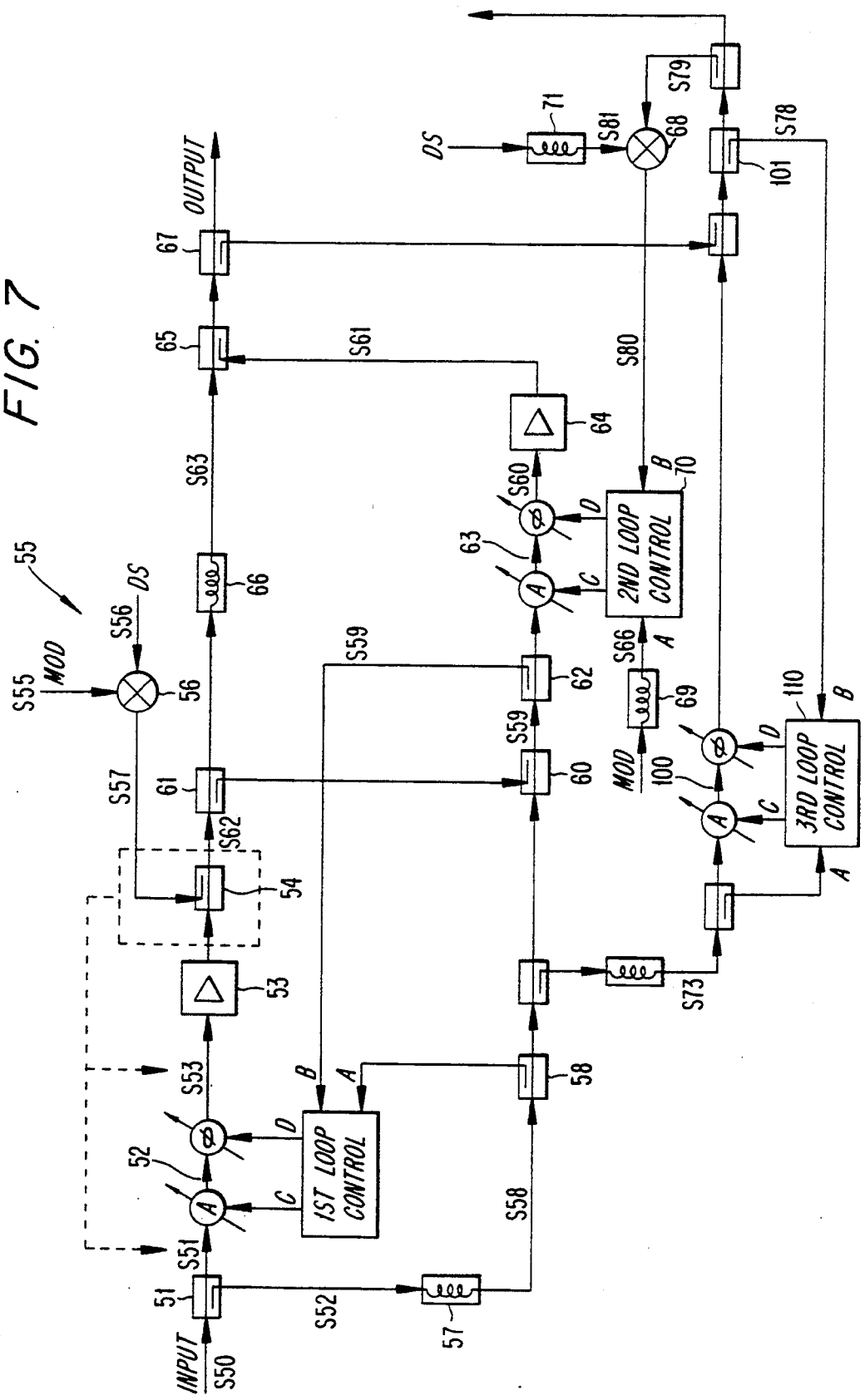
FIG. 7 illustrates an addition of a third loop to reduce the interference power before the remapping of the spreaded spectrum.

FIG. 7 illustrates in block diagram form another embodiment of the present invention which adds a third loop controller to the circuit illustrated in FIG. 4. In this embodiment, the amplified input signals are suppressed before the remapping process, thereby reducing the processing gain needed. The suppression is achieved by subtracting a gain and phase adjusted sample of the input signal S50 from the sampled output signal S64. In order to determine the correct setting of the amplitude and phase controller 100, the difference signal S78, sampled by the sampler 101, is correlated in the third loop controller 110 with a delayed sample S73 of the input signal, thereby controlling the amplitude and phase controller 100 and substantially reducing the input signal content in the difference signal S78. The function of the third loop controller 110 is therefore essentially the same as the function of the first loop controller. The signal S78 can also be regarded as a new error signal which contains the remaining distortion present in the intermediate output signal S64. The sampled error signal S79 is despreaded in a multiplier 68, with the aid of a time delayed copy of the spreading sequence S81. The signal S80 will therefore contain the remapped control signal which is correlated with the reference control signal S66 in the second loop controller 70.

Figure 8:
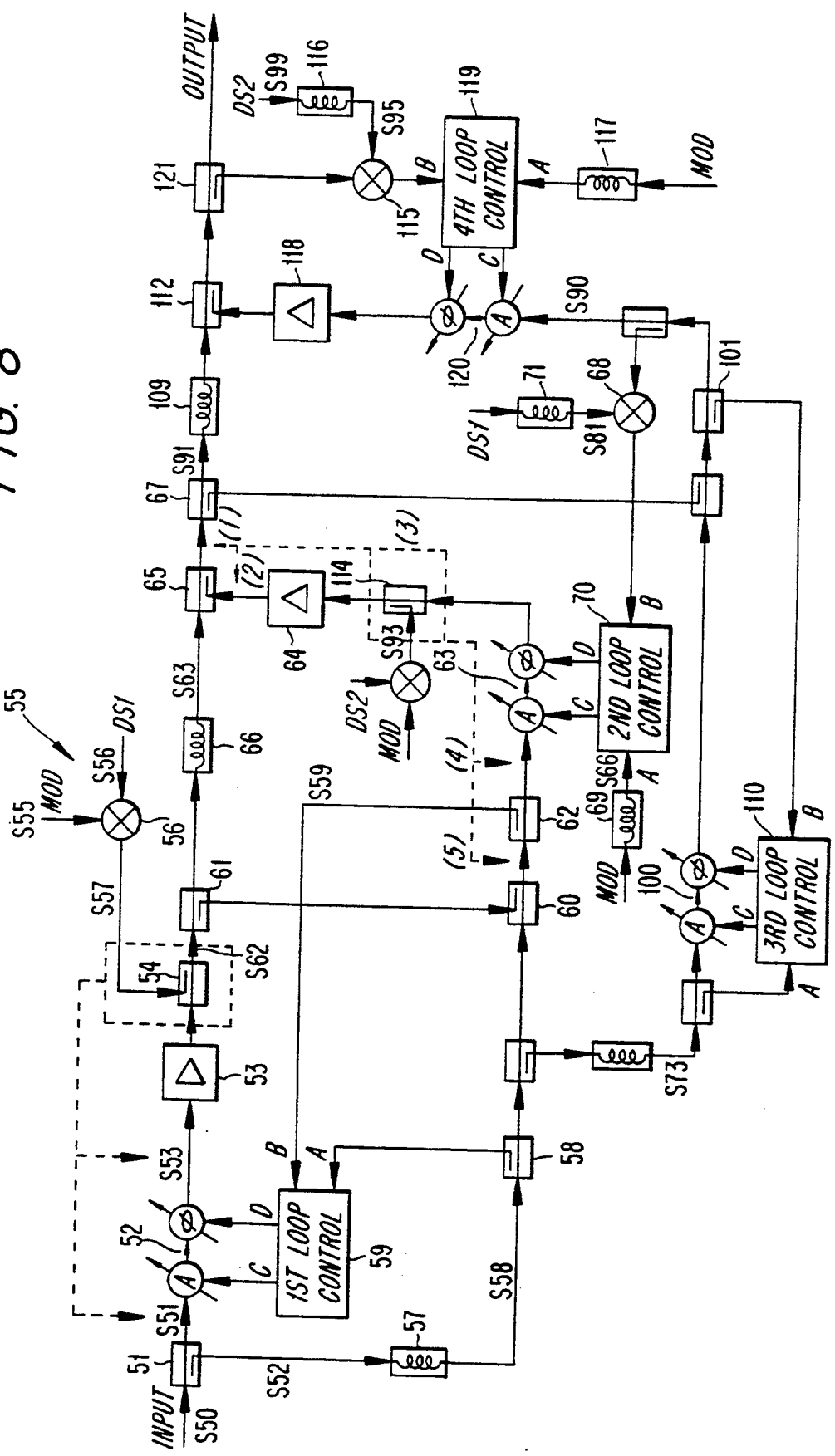
FIG. 8 illustrates a further addition of a fourth injection loop to increase the distortion reduction.

Referring to FIG. 8, there is shown another embodiment of the present invention which adds a fourth loop controller to the feed forward amplifier system. In this embodiment, the new error signal S90 is injected into the output signal path S91 by means of an injection coupler 112 which results in an increase in suppression of the distortion emanating from the main amplifier 53 and also a suppression of the distortion emanating from the error amplifier 64 and also from other components.

FIG. 8 also shows a second frequency spreaded control signal S93 which is injected through injection coupler 114. The injection coupler can be positioned several positions (1)–(5) in the circuit. The optional placement (1) and (2) have the advantage in that there is no loss in the processing gain achieved in the remapping process performed in the multiplier 115. These optional placements are, however, at high signal levels, especially the placement (1). The placements also require the time delay elements 116 and 117 to be reduced to only the delay introduced by the auxiliary error amplifier 118. A new time delay element 109 is introduced in the main amplifier output path to account for the time delay caused by the auxiliary error amplifier 118. The reduction in the processing gain when any of the placements (3)–(5) is used is dependent on the frequency response of the error amplifier 64. The placements (4) and (5) will cause the fourth loop controller 119 to be dependent on the setting of the second loop controller 70.

The purpose of the injection of the second frequency spreaded control signal is to control the setting of the amplitude and phase controller 120, thereby subtracting the new error signal from the time delayed intermediate output signal S91. The function of the fourth loop controller 119 is therefore essentially equal to the function of the second loop controller.

The two injected composite signals should be orthogonal or noncorrelated with each other so that they do not interfere with each other. The orthogonality of the composite signals can be achieved in several ways. First, the carrier frequencies of the control signals can be made different from each other. As a result, the spreading sequences can be equal. In the alternative, the spreading sequences can be orthogonal to each other. As a result, the control signals can be equal.

Since the sampled intermediate output signal contains high levels of amplified input signal components, there is a high demand on the processing gain in the remapping process performed in the multiplier 115. This can be achieved by either one or a combination of the following: increasing the power on the frequency spreaded control signal S93; increasing the bandwidth of the spreading sequence S99; and increasing the integration time in the fourth loop controller 119.

Figure 9:
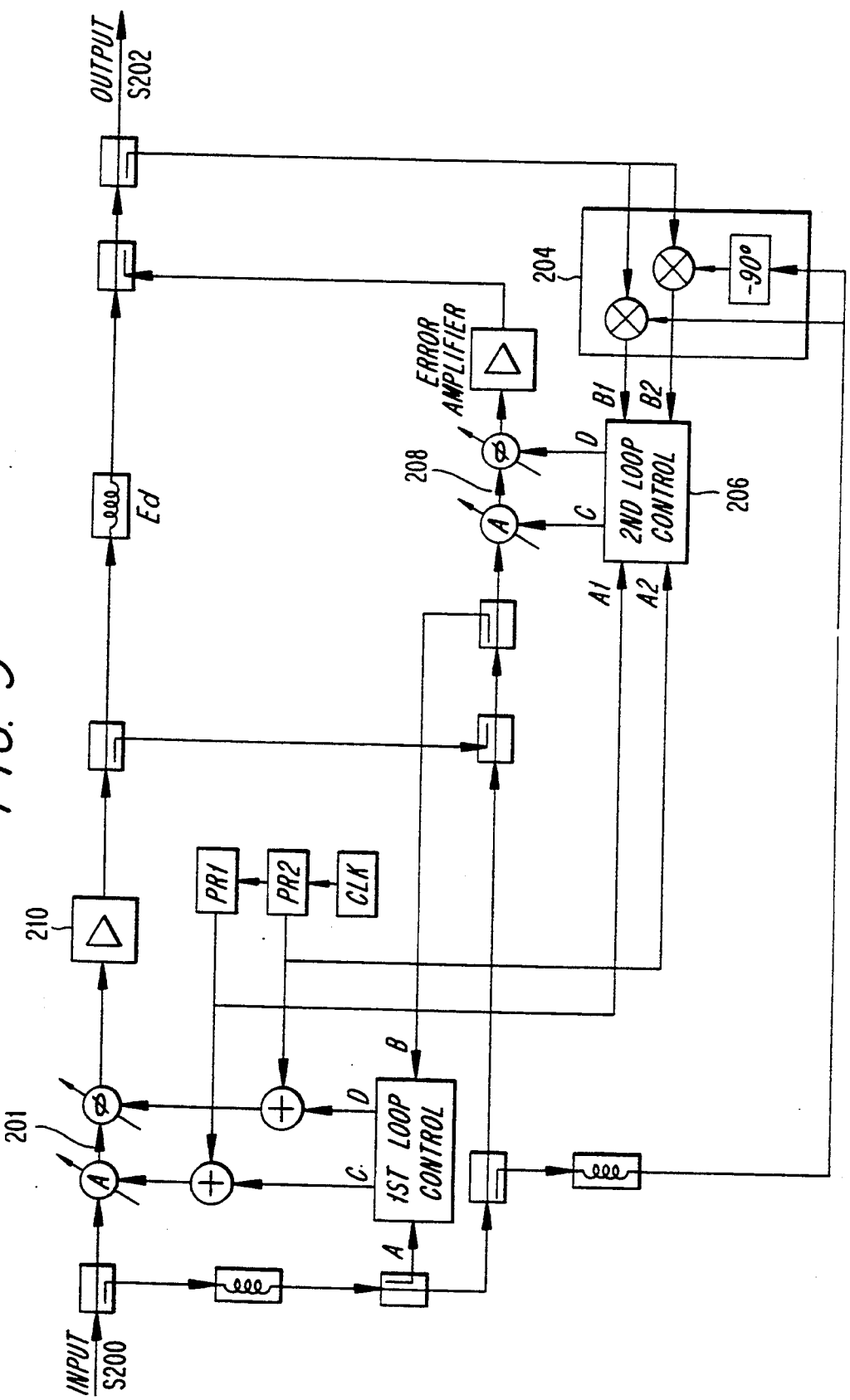
FIG. 9 illustrates another embodiment of the present invention.

FIG. 9 illustrates another method for controlling a feed forward amplifier system according to one embodiment of the present invention. In this embodiment, the input signals to the feed forward amplifier system are used as "carriers" for the injected simulated distortion. This eliminates the need for an additional RF-oscillator in the feed-forward amplifier system. By using the input signals as carriers for the simulated distortion, the present invention has the advantage that the simulated distortion, which is minimized at the output of the system thereby minimizing the distortion caused by the main amplifier, is situated in the frequency range where it is actually needed. In other words, the simulated distortion will measure the system response at the best frequency location. The present embodiment also has the advantage that the power relationship between the total input signal and the injected simulated distortion is independent of the input signal power. FIG. 9 illustrates one implementation of this method for a second loop controller.

An input signal S200 is modulated in amplitude by a pseudo random sequence PR1 and in phase by a pseudo random sequence PR2 through the amplitude and phase controller 201. The output signal S203 is sampled and demodulated in an I-Q demodulator 204 with a delayed replica of the input signal S200. The resulting demodulated signal is correlated with replicas of the modulation signals PR1 and PR2 in the second loop controller or matched filter correlator 206 to produce an adjustment signal which yields a setting of the amplitude and phase controller 208. An error signal S210 is then combined with the output signal S202 thereby essentially minimizing the modulation of the input signal and the distortion introduced by the main amplifier 210 from the output signal S202.

The above described arrangement merely illustrates the principles of the present invention. Numerous modifications and adaptations thereof will be readily apparent to those skilled in the art without departing from the scope and spirit of the present invention.

What is claimed is:

1. A linear amplifier controller for reducing distortion in a feed forward amplifier system, comprising:
    a spread spectrum signal generating means for frequency spreading a control signal;
    a first combining means for combining an input signal and said frequency spreaded control signal;
    a first sampling means including an input port for receiving said combined signals from said first combining means and first and second output ports;
    an amplifying means coupled to said first output port of said first sampling means for amplifying said combined signal received from said first sampling means;
    a first delay element coupled to said second output port of said first signal sampling means for delaying said combined signal received from said first signal sampling means to produce a delayed combined signal;
    first amplitude and phase control means coupled to said first delay means for controlling the relative amplitude and phase of said delayed combined signal;
    a second combining means for combining said amplified signal from said amplifying means and an adjusted signal from said amplitude and phase control means to produce an output signal;
    a second sampling means including a first input port for receiving said output signal and first and second output ports;
    a remapping means coupled to said first output port of said second sampling means for remapping the output signal from said second sampling means with a spread sequence which has been delayed by a second delay means;
    a third delay means for receiving said control signals; and
    a matched filter correlator means for correlating said delayed output signal received from said third delay means and said remapped signal received from said remapping means for controlling the first amplitude and phase control means.

2. A linear amplifier controller for reducing distortion according to claim 1, wherein said signal generator comprises:
    a pseudo noise sequence generator which is driven by a first clock to produce a first signal;
    a modulator which modulates a carrier signal with said first signal to produce a carrier modulated signal;
    a spreading sequence generator which is driven by a second clock to produce a spreading sequence; and
    a multiplier for multiplying said carrier modulated signal with said spreading sequence to produce a composite signal.

3. A linear amplifier controller for reducing distortion according to claim 2, wherein said spreading sequence generator and said pseudo noise sequence generator are of a maximum length type.

4. A linear amplifier controller for reducing distortion according to claim 2, wherein said modulator is a MSK modulator.

5. A linear amplifier controller for reducing distortion according to claim 2, wherein said modulator is an OQPSK modulator.

6. A linear amplifier controller for reducing distortion according to claim 1, wherein the delay introduced by the first, second and third delay means is equal to the delay introduced by the amplifying means.

7. A linear amplifier controller for reducing distortion in a feed forward amplifier system, comprising:
- a first sampling means including an input port for receiving an input signal and first and second output ports;
- a first amplitude and phase control means coupled to said first output port of said first sampling means for controlling the amplitude and phase of said input signal;
- a first amplifying means coupled to said first amplitude and phase control means for amplifying said input signal received from said first amplitude and phase control means;
- a spread spectrum signal generating means for frequency spreading a control signal;
- a first combining means for combining said amplified signal from said amplifying means and said frequency spreaded control signal from said signal generator to produce a first combined signal;
- a second sampling means including an input port for receiving said combined signal and first and second output ports;
- a first delay means coupled to said first sampling means for delaying said input signal;
- a third sampling means including a first input port for receiving said first delayed input signal from said delay means and first and second output ports;
- a second combining means for combining said delayed input signal from said first output port of said third sampling means and said first combined signal from said second sampling means to produce a second combined signal;
- a fourth sampling means including an input port for receiving said second combined signal from said second combining means and first and second output ports;
- a first loop controller which correlates said time delayed input signal from said second output port of said third sampling means and said second combined signal from said second output port of said fourth sampling means to control the first amplitude and phase control means;
- a second amplitude and phase control means coupled to said first output port of said fourth sampling means for controlling the amplitude and phase of said second combined signal;
- a second amplifying means coupled to said second amplitude and phase control means for amplifying said second combined signal received from said second amplitude and phase control means;
- a second delay means coupled to said second output port of said second sampling means for delaying said first combined signal;
- a third combining means for combining said first combined signal received from said second delay means and said amplified signal from said second amplifying means to produce a third combined signal;
- a fifth sampling means including an input port for receiving said third combined signal and first and second output ports;
- a remapping means coupled to said first output port of said fifth sampling means for remapping the output signal from said fifth sampling means with a spreading sequence which has been delayed by a third delay means;
- a fourth delay means for receiving said control signal; and
- a second loop control means for correlating said delayed control signal received from said fourth delay means with said remapped signal from said remapping means to control the second amplitude and phase control means.

8. A linear amplifier controller for reducing distortion according to claim 7, wherein said signal generator comprises:
- a pseudo noise sequence generator which is driven by a first clock to produce a first signal;
- a modulator which modulates a carrier signal with said first signal to produce a carrier modulated signal;
- a spreading sequence generator which is driven by a second clock to produce a spreading sequence; and
- a multiplier for multiplying said carrier modulated signal with said spreading sequence to produce a composite signal.

9. A linear amplifier controller for reducing distortion according to claim 8, wherein said spreading sequence generator and said pseudo noise sequence generator are of a maximum length type.

10. A linear amplifier controller for reducing distortion according to claim 8, wherein said modulator is a MSK modulator.

11. A linear amplifier controller for reducing distortion according to claim 8, wherein said modulator is an OQPSK modulator.

12. A linear amplifier controller for reducing distortion according to claim 7, wherein said first delay means introduces a delay which is equal to the delay introduced by the first amplifying means.

13. A linear amplifier controller for reducing distortion according to claim 7, wherein said second, third and fourth delay means introduce a delay which is equal to the delay introduced by the second amplifying means.

14. A linear amplifier controller for reducing distortion in a feed forward amplifier system, comprising:
- a first sampling means including an input port for receiving an input signal and first and second output ports;
- a first amplitude and phase control means coupled to said first output port of said first sampling means for controlling the amplitude and phase of said input signal;
- a first amplifying means coupled to said first amplitude and phase control means for amplifying said input signal received from said first amplitude and phase control means;
- a spread spectrum signal generating means for frequency spreading a control signal;
- a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to said first output port of said fourth sampling means for controlling the amplitude and phase of said second combined signal;

a second amplifying means coupled to said second amplitude and phase control means for amplifying said second combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

a fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapped signal from said remapping means to control the second amplitude and phase control means;

a sixth sampling means coupled between the output of said third sampling means and the input of said second combining means including an input port for receiving said delayed input signal and first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said third combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means; and a third loop control means for correlating said delayed input signal from said second output port of said seventh sampling means and said fourth combined signal from said second output port of said eighth sampling means to control said third amplitude and phase control means.

15. A linear amplifier controller for reducing distortion according to claim 14, the delay introduced by the second, third, fourth and fifth delay means is equal to the delay introduced by the second amplifying means.

16. A linear amplifier controller for reducing distortion in a feed forward amplifier system, comprising:

a first sampling means including an input port for receiving an input signal and first and second output ports;

a first amplitude and phase control means coupled to said first output port of said first sampling means for controlling the amplitude and phase of said input signal;

a first amplifying means coupled to said first amplitude and phase control means for amplifying said input signal received from said first amplitude and phase control means;

a spread spectrum signal generating means for frequency spreading a control signal;

a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to said first output port of said fourth sampling means for controlling the amplitude and phase of said second combined signal;

a second amplifying means coupled to said second amplitude phase control means for amplifying said second combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapping signal from said remapping means to control the second amplitude and phase control means;

a sixth sampling means coupled between the output of said third sampling means and the input of said second combining means including an input port for receiving said delayed input signal said first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said third combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means;

a third loop control means for correlating said delayed input signal from said second output port of said seventh sampling means and said fourth combined signal from said second output pert of said eighth sampling means to control said third amplitude and phase control means;

a second spread spectrum signal generating means for frequency spreading said control signal;

a fifth combining means coupled between said second amplitude and phase control means and said second amplifying means for combining said frequency spreaded control signal with said second combined signal from said second amplitude and phase control means and supplying a fifth combined signal to said second amplifying means;

a sixth delay means coupled to said first output port of said fifth sampling means for delaying said third combined signal;

a fourth amplitude and phase control means coupled to said second output port of said ninth sampling means for adjusting the amplitude and phase of said fourth combined signal;

a third amplifying means coupled to said fourth amplitude and control means for amplifying said adjusted fourth combined signal received from said fourth amplitude and phase control means;

a sixth combining means for combining said delayed third combined signal received from said sixth delay element and said amplified signal from said third amplifying means to produce a sixth combined signal;

a tenth sampling means including an input port for receiving said sixth combined signal from said sixth combining means and first and second output ports;

a second remapping means coupled to said second output port of said tenth sampling means for remapping the output signal from said tenth sampling means with a second spreading sequence which has been delayed by a seventh delay means;

a eighth delay means for receiving said control signal; and a fourth loop control means for correlating said delayed input signal received from said eighth delay means with said remapped signal from said second remapping means to control said fourth amplitude and phase control means.

17. A linear amplifier controller for reducing distortion according to claim 16, wherein said second signal generating means comprises:

a pseudo noise sequence generator which is driven by a first clock to produce a first signal;

a modulator which modulates a carrier signal with said first signal to produce a carrier modulated signal;

a second spreading sequence generator which is driven by a second clock to produce a spreading sequence; and a multiplier for multiplying said carrier modulated signal with said spreading sequence to produce a composite signal.

18. A linear amplifier controller for reducing distortion according to claim 17, wherein said spreading sequence generator and said pseudo noise sequence generator are of a maximum length type.

19. A linear amplifier controller for reducing distortion according to claim 17, wherein said modulator is a MSK modulator.

20. A linear amplifier controller for reducing distortion according to claim 17, wherein said modulator is an OQPSK modulator.

21. A method for controlling a feed forward compensated power amplifier system, comprising the steps of:

generating a spread spectrum composite signal from control signals using spread spectrum techniques;

injecting the frequency spread spectrum composite signals into the feed forward amplifier system where the distortion originates;

remapping the spread spectrum composite signal at the output of the amplifier system;

correlating the remapped signal with said control signals;

controlling the cancellation of the frequency spread control signals and the distortion introduced by the amplifier at the output of the feed forward amplifier system.

22. A method for controlling a feed forward compensated power amplifier system according to claim 21, wherein said step of injecting further comprises injecting said frequency spread control signals into the amplifier system at any point along a path from where the distortion originates.

23. A method for controlling a feed forward compensated power amplifier system according to claim 21, wherein in aid step of generating the spread spectrum composite signal a frequency of said control signals is arbitrary.

24. A method for controlling a feed forward compensated power amplifier system according to claim 23, further comprising the step of:

calculating best frequency of the control signals in the system using received information concerning transmission channels.

25. A method for controlling a feed forward compensated power amplifier system according to claim 21, further comprising the step of:

calculating best frequency of the control signals in the system using received information on where to minimize the distortion.

26. A method for controlling a feed forward compensated power amplifier system according to claim 21, further comprising the step of:

interchanging a power of the control signals integration time after remapping and the spread spectrum to increase the systems flexibility regarding settling time.

27. A method for controlling a feed forward compensated power amplifier system according to claim 21, further comprising the step of:

arbitrarily modulating the control signals to increase the tolerance against interfering signals present at the frequencies of the control signals.

28. A method for controlling a feed forward compensated power amplifier system according to claim 21, wherein in said step of generating a spread spectrum composite signal governing the spread spectrum by the amount of processing gain needed in the remapping process.

29. A linear amplifier controller for reducing distortion in a feed forward amplifier system, comprising:

a first sampling means including an input port for receiving an input signal and first and second output ports;

a first amplitude and phase control means coupled to said first output port of said first sampling means for controlling the amplitude and phase of said input signal;

a spread spectrum signal generating means for frequency spreading a control signal;

a first combining means for combining an output signal from said first amplitude and phase control means and said frequency spreaded control signal from said signal generating means to produce a first combined signal;

a first amplifying means coupled to said first combining means for amplifying said first combined signal;

a second sampling means including an input port for receiving said amplified first combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to said first output port of said fourth sampling means for controlling the amplitude and phase of said second combined signal;

a second amplifying means coupled to said second amplitude and phase control means for amplifying said second combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

a fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal; and a second loop control means for correlating said delayed control signal received from said fourth delay means with said remapped signal from said remapping means to control the second amplitude and phase control means.

30. A linear amplifier controller for reducing distortion according to claim 29, wherein said signal generating means comprises:

a pseudo noise sequence generator which is driven by a first clock to produce a first signal;

a modulator which modulates a carrier signal with said first signal to produce a carrier modulated signal;

a spreading sequence generator which is driven by a second clock to produce a spreading sequence; and a multiplier for multiplying said carrier modulated signal with said spreading sequence to produce a composite signal.

31. A linear amplifier controller for reducing distortion according to claim 29, wherein said spreading sequence generator and said pseudo noise sequence generator are of a maximum length type.

32. A linear amplifier controller for reducing distortion according to claim 29, wherein said modulator is a MSK modulator.

33. A linear amplifier controller for reducing distortion according to claim 29, wherein said modulator is an OQPSK modulator.

34. A linear amplifier controller for reducing distortion according to claim 29, wherein the delay introduced by the second, third and fourth delay means is equal to the delay introduced by the first and second amplifying means.

35. A linear amplifier controller for reducing distortion in a feed forward amplifier system, comprising:
- a first sampling means including an input port for receiving an input signal and first and second output ports;
- a spread spectrum signal generating means for frequency spreading a control signal;
- a first combining means for combining a signal from said first sampling means and said frequency spreaded control signal from said signal generating means to produce a first combined signal;
- a first amplitude and phase control means coupled to said first combining means for controlling the amplitude and phase of said first combined signal;
- a first amplifying means coupled to said first amplitude and phase control means for amplifying said combined signal received from said first amplitude and phase control means;
- a second sampling means including an input port for receiving said amplified combined signal and first and second output ports;
- a first delay means coupled to said first sampling means for delaying said input signal;
- a third sampling means including a first input port for receiving said first delayed input signal from said delay means and first and second output ports;
- a second combining means for combining said delayed input signal from said first output port of said third sampling means and said first combined signal from said second sampling means to produce a second combined signal;
- a fourth sampling means including an input port for receiving said second combined signal from said second combining means and first and second output ports;
- a first loop controller which correlates said time delayed input signal from said second output port of said third sampling means and said second combined signal from said second output port of said fourth sampling means to control the first amplitude and phase control means;
- a second amplitude and phase control means coupled to said first output port of said fourth sampling means for controlling the amplitude and phase of said second combined signal;
- a second amplifying means coupled to said second amplitude and phase control means for amplifying said second combined signal received from said second amplitude and phase control means;
- a second delay means coupled to said second output port of said second sampling means for delaying said first combined signal;
- a third combining means for combining said first combined signal received from said second delay means and said amplified signal from said second amplifying means to produce a third combined signal;
- a fifth sampling means including an input port for receiving said third combined signal and first and second output ports;
- a remapping means coupled to said first output port of said fifth sampling means for remapping the output signal from said fifth sampling means with a spreading sequence which has been delayed by a third delay means;
- a fourth delay means for receiving said control signal; and
- a second loop control means for correlating said delayed control signal received from said fourth delay means with said remapped signal from said remapping means to control the second amplitude and phase control means.

36. A linear amplifier controller for reducing distortion according to claim 35, wherein said signal generating means comprises:
- a pseudo noise sequence generator which is driven by a first clock to produce a first signal;
- a modulator which modulates a carrier signal with said first signal to produce a carrier modulated signal;
- a spreading sequence generator which is driven by a second clock to produce a spreading sequence; and
- a multiplier for multiplying said carrier modulated signal with said spreading sequence to produce a composite signal.

37. A linear amplifier controller for reducing distortion according to claim 35, wherein said spreading sequence generator and said pseudo noise sequence generator are of a maximum length type.

38. A linear amplifier controller for reducing distortion according to claim 35, wherein said modulator is a MSK modulator.

39. A linear amplifier controller for reducing distortion according to claim 35, wherein said modulator is an OQPSK modulator.

40. A linear amplifier controller for reducing distortion according to claim 35, wherein the delay introduced by said second, third and fourth delay means is equal to the delay introduced by the first and second amplifying means.

41. A linear amplifier controller for reducing distortion in a feed forward amplifier system, comprising:
- a first sampling means including an input port for receiving an input signal and first and second output ports;
- a first amplitude and phase control means coupled to said first output port of said first sampling means for controlling the amplitude and phase of said input signal;
- a first amplifying means coupled to said first amplitude and phase control means for amplifying said input signal received from said first amplitude and phase control means;
- a spread spectrum signal generating means for frequency spreading a control signal;
- a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to said first output port of said fourth sampling means for controlling the amplitude and phase of said second combined signal;

a second amplifying means coupled to said second amplitude and phase control means for amplifying said second combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

a fifth sampling means including an input port for receiving a fifth combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapped signal from said remapping means to control the second amplitude and phase control means;

a sixth sampling means coupled between the output of said third sampling means and the input of said second combining means including an input port for receiving said delayed input signal and first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said fifth combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means;

a third loop control means for correlating said delayed input signal from said second output port of said seventh sampling means and said fourth combined signal from said second output port of said eighth sampling means to control said third amplitude and phase control means;

a second spread spectrum signal generating means for frequency spreading said control signal;

a fifth combining means coupled between said output of said third combining means and the input of said fifth sampling means for combining said frequency spreaded control signal with said third combined signal and supplying said fifth combined signal to said fifth sampling means;

a sixth delay means coupled to said first output port of said fifth sampling means for delaying said fifth combined signal;

a fourth amplitude and phase control means coupled to said second output port of said ninth sampling means for adjusting the amplitude and phase of said fourth combined signal;

a third amplifying means coupled to said fourth amplitude and control means for amplifying said adjusted fourth combined signal received from said fourth amplitude and phase control means;

a sixth combining means for combining said delayed fifth combined signal received from said sixth delay element and said amplified signal from said third amplifying means to produce a sixth combined signal;

a tenth sampling means including an input port for receiving said sixth combined signal from said sixth combining means and first and second output ports;

a second remapping means coupled to said second output port of said tenth sampling means for remapping the output signal from said tenth sampling means with a second spreading sequence which has been delayed by a seventh delay means;

a eighth delay means for receiving said control signal; and a fourth loop control means for correlating said delayed input signal received from said eighth delay means with said remapped signal from said second remapping means to control said fourth amplitude and phase control means.

42. A linear amplifier controller for reducing distortion in a feed forward amplifier system, comprising:

a first sampling means including an input port for receiving an input signal and first and second output ports;

a first amplitude and phase control means coupled to said first output port of said first sampling means for controlling the amplitude and phase of said input signal;

a first amplifying means coupled to said first amplitude and phase control means for amplifying said input signal received from said first amplitude and phase control means;

a spread spectrum signal generating means for frequency spreading a control signal;

a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to said first output port of said fourth sampling means for controlling the amplitude and phase of said second combined signal;

a second amplifying means coupled to said second amplitude and phase control means for amplifying said second combined signal received from said second amplitude and phase control means;

a second delay means coupled to said second output port of said second sampling means for delaying said first combined signal;

a third combining means for combining said first combined signal received from said second delay means and a fifth combined signal from a fifth combining means to produce a third combined signal;

a fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapped signal from said remapping means to control the second amplitude and phase control means;

a sixth sampling means coupled between the output of said third sampling means and the input of said second combining means including an input port for receiving said delayed input signal and first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said third combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means;

a third loop control means for correlating said delayed input signal from said second output port of said seventh sampling means and said fourth combined signal from said second output port of said eighth sampling means to control said third amplitude and phase control means;

a second spread spectrum signal generating means for frequency spreading said control signal;

said fifth combining means coupled between said output of said second amplifying means and said input of said third combining means for combining said frequency spreaded control signal with said amplified second combined signal and supplying said fifth combined signal to said third combining means;

a sixth delay means coupled to said first output port of said fifth sampling means/for delaying said third combined signal;

a fourth amplitude and phase control means coupled to said second output port of said ninth sampling means for adjusting the amplitude and phase of said fourth combined signal;

a third amplifying means coupled to said fourth amplitude and control means for amplifying said adjusted fourth combined signal received from said fourth amplitude and phase control means;

a sixth combining means for combining said delayed third combined signal received from said sixth delay element and said amplified signal from said third amplifying means to produce a sixth combined signal;

a tenth sampling means including an input port for receiving said sixth combined signal from said sixth combining means and first and second output ports;

a second remapping means coupled to said second output port of said tenth sampling means for remapping the output signal from said tenth sampling means with a second spreading sequence which has been delayed by a seventh delay means;

a eighth delay means for receiving said control signal; and a fourth loop control means for correlating said delayed input signal received from said eighth delay means with said remapped signal from said second remapping means to control said fourth amplitude and phase control means.

43. A linear amplifier controller for reducing distortion in a feed forward amplifier system, comprising:

a first sampling means including an input port for receiving an input signal and first and second output ports;

a first amplitude and phase control means coupled to said first output port of said first sampling means for controlling the amplitude and phase of said input signal;

a first amplifying means coupled to said first amplitude and phase control means for amplifying said input signal received from said first amplitude and phase control means;

a spread spectrum signal generating means for frequency spreading a control signal;

a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving said second combined signal from said second combining means and first and second output ports;

a first loop controller which correlates said time delayed input signal from said second output port of said third sampling means and said second combined signal from said second output port of said fourth sampling means to control the first amplitude and phase control means;

a second amplitude and phase control means coupled to a fifth combining means for controlling the amplitude and phase of a fifth combined signal;

a second amplifying means coupled to said second amplitude and phase control means for amplifying said fifth combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

a fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapped signal from said remapping means to control the second amplitude and phase control means;

a sixth sampling means coupled between the output of said third sampling means and the input of said second combining means including an input port for receiving said delayed input signal and first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said third combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means;

a third loop control means for correlating said delayed input signal from said second output port of said seventh sampling means and said fourth combined signal from said second output port of said eighth sampling means to control said third amplitude and phase control means;

a second spread spectrum signal generating means for frequency spreading said control signal;

said fifth combining means coupled between said first output port of said fourth sampling means and the input of said second amplitude and phase control means for combining said frequency spreaded control signal with a signal from said fourth sampling means and supplying said fifth combined signal to said second amplitude and phase control means;

a sixth delay means coupled to said first output port of said fifth sampling means for delaying said third combined signal;

a fourth amplitude and phase control means coupled to said second output port of said ninth sampling means for adjusting the amplitude and phase of said fourth combined signal;

a third amplifying means coupled to said fourth amplitude and control means for amplifying said adjusted fourth combined signal received from said fourth amplitude and phase control means;

a sixth combining means for combining said delayed third combined signal received from said sixth delay element and said amplified signal from said third amplifying means to produce a sixth combined signal;

a tenth sampling means including an input port for receiving said sixth combined signal from said sixth combining means and first and second output ports;

a second remapping means coupled to said second output port of said tenth sampling means for remapping the output signal from said tenth sampling means with a second spreading sequence which has been delayed by a seventh delay means;

a eighth delay means for receiving said control signal; and a fourth loop control means for correlating said delayed input signal received from said eighth delay means with said remapped signal from said second remapping means to control said fourth amplitude and phase control means.

44. A linear amplifier controller for reducing distortion in a feed forward amplifier system, comprising:

a first sampling means including an input port for receiving an input signal and first and second output ports;

a first amplitude and phase control means coupled to said first output port of said first sampling means for controlling the amplitude and phase of said input signal;

a first amplifying means coupled to said first amplitude and phase control means for amplifying said input signal received from said first amplitude and phase control means;

a spread spectrum signal generating means for frequency spreading a control signal;

a first combining means for combining said amplified signal from said amplifying means and said frequency spreaded control signal from said signal generator to produce a first combined signal;

a second sampling means including an input port for receiving said combined signal and first and second output ports;

a first delay means coupled to said first sampling means for delaying said input signal;

a third sampling means including a first input port for receiving said first delayed input signal from said delay means and first and second output ports;

a second combining means for combining said delayed input signal from said first output port of said third sampling means and said first combined signal from said second sampling means to produce a second combined signal;

a fourth sampling means including an input port for receiving a fifth combined signal from a fifth combining means and first and second output ports;

a first loop controller which correlates said time delayed input signal from said second output port of said third sampling means and said fifth combined signal from said second output port of said fourth sampling means to control the first amplitude and phase control means;

a second amplitude and phase control means coupled to said first output port of said fourth sampling means for controlling the amplitude and phase of said fifth combined signal;

a second amplifying means coupled to said second amplitude and phase control means for amplifying said second combined signal received from said second amplitude and phase control means;

a second delay means coupled to said second output port of said second sampling means for delaying said first combined signal;

a third combining means for combining said first combined signal received from said second delay means and said amplified signal from said second amplifying means to produce a third combined signal;

a fifth sampling means including an input port for receiving said third combined signal and first and second output ports;

a remapping means coupled to said first output port of said fifth sampling means for remapping the output signal from said fifth sampling means with a spreading sequence which has been delayed by a third delay means;

a fourth delay means for receiving said control signal;

a second loop control means for correlating said delayed control signal received from said fourth delay means with said remapped signal from said remapping means to control the second amplitude and phase control means;

a sixth sampling means coupled between the output of said third sampling means and the input of said second combining means including an input port for receiving said delayed input signal and first and second output ports;

a fifth delay means coupled to said second output port of said sixth sampling means to further delay the delayed input signal;

a seventh sampling means including an input port for receiving said delayed signal from said fifth delay means and first and second output ports;

a third amplitude and phase control means coupled to said first output of said seventh sampling means for controlling the amplitude and phase of said delayed input signal;

a fourth combining means for combining the signal from said third amplitude and phase control means and said third combined signal from the first output port of said fifth sampling means to produce a fourth combined signal;

an eighth sampling means including an input port for receiving said fourth combined signal from said fourth combining means and first and second output ports;

a ninth sampling means including an input port for receiving said fourth combined signal from the first output port of said eighth sampling means and first and second output ports, wherein the first output port is connected to said remapping means;

a third loop control means for correlating said delayed input signal from said second output port of said seventh sampling means and said fourth combined signal from said second output port of said eighth sampling means to control said third amplitude and phase control means;

a second spread spectrum signal generating means for frequency spreading said control signal;

said fifth combining means coupled between said output of said second combining means and said input of said fourth sampling means for combining said frequency spreaded control signal with said second combined signal and supplying said fifth combined signal to said input of said fourth sampling means;

a sixth delay means coupled to said first output port of said fifth sampling means for delaying said third combined signal;

a fourth amplitude and phase control means coupled to said second output port of said ninth sampling means for adjusting the amplitude and phase of said fourth combined signal;

a third amplifying means coupled to said fourth amplitude and control means for amplifying said adjusted fourth combined signal received from said fourth amplitude and phase control means;

a sixth combining means for combining said delayed third combined signal received from said sixth delay element and said amplified signal from said third amplifying means to produce a sixth combined signal;

a tenth sampling means including an input port for receiving said sixth combined signal from said sixth combining means and first and second output ports;

a second remapping means coupled to said second output port of said tenth sampling means for remapping the output signal from said tenth sampling means with a second spreading sequence which has been delayed by a seventh delay means;

a eighth delay means for receiving said control signal; and a fourth loop control means for correlating said delayed input signal received from said eighth delay means with said remapped signal from said second remapping means to control said fourth amplitude and phase control means.

* * * * *